(12) United States Patent
Siddiqui et al.

(10) Patent No.: US 10,438,853 B2
(45) Date of Patent: Oct. 8, 2019

(54) METHODS, APPARATUS AND SYSTEM FOR FORMING A FINFET DEVICE COMPRISING A FIRST PORTION CAPABLE OF OPERATING AT A FIRST VOLTAGE AND A SECOND PORTION CAPABLE OF OPERATING AT A SECOND VOLTAGE

(71) Applicant: GLOBALFOUNDRIES INC., Grand Cayman (KY)

(72) Inventors: Shahab Siddiqui, Clifton Park, NY (US); Beth Baumert, Ballston Lake, NY (US); Abu Naser M. Zainuddin, Ballston Lake, NY (US); Luigi Pantisano, Saratoga Spring, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/821,684

(22) Filed: Nov. 22, 2017

(65) Prior Publication Data

US 2019/0157157 A1 May 23, 2019

(51) Int. Cl.
*H01L 21/8234* (2006.01)
*C23C 16/455* (2006.01)
(Continued)

(52) U.S. Cl.
CPC ........... *H01L 21/823462* (2013.01); *C23C 16/45525* (2013.01); *C23C 16/50* (2013.01); *H01L 21/0214* (2013.01); *H01L 21/0223* (2013.01); *H01L 21/0228* (2013.01); *H01L 21/02164* (2013.01); *H01L 21/02178* (2013.01); *H01L 21/02181* (2013.01); *H01L 21/02186* (2013.01); *H01L 21/02192* (2013.01); *H01L 21/02247* (2013.01); *H01L 21/02252* (2013.01);
(Continued)

(58) Field of Classification Search
CPC . H01L 21/033–0338; H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/66545
See application file for complete search history.

(56) References Cited

U.S. PATENT DOCUMENTS 6,740,944 B1   5/2004   McElheny et al.
9,196,700 B2  11/2015   Chudzik et al.
(Continued)

*Primary Examiner* — Laura M Menz
*Assistant Examiner* — Candice Chan
(74) *Attorney, Agent, or Firm* — Williams Morgan, P.C.

(57) ABSTRACT

At least one method, apparatus and system are provided for forming a hybrid oxide layer for providing for a first region of a finFET device to operate at a first voltage and a second region of the finFET to operate at a second voltage. A first set of fins are formed on an I/O device portion, and a second set of fins are formed on a core device portion of a substrate. A first and a second oxide layers are deposited on the first and second set of fins, wherein they merge to form a hybrid oxide layer. The thickness of the second oxide layer is based on a first operating voltage for the I/O device portion. The hybrid layer is removed from the core device portion such that the I/O device portion operates at the first voltage and the core device portion operates at a second voltage.

13 Claims, 8 Drawing Sheets

(51) Int. Cl.
*H01L 21/02* (2006.01)
*H01L 21/28* (2006.01)
*H01L 27/088* (2006.01)
*H01L 29/423* (2006.01)
*H01L 29/49* (2006.01)
*H01L 29/51* (2006.01)
*H01L 29/66* (2006.01)
*H01L 21/311* (2006.01)
*C23C 16/50* (2006.01)

(52) U.S. Cl.
CPC .. *H01L 21/02274* (2013.01); *H01L 21/28088* (2013.01); *H01L 21/28194* (2013.01); *H01L 21/31111* (2013.01); *H01L 21/31144* (2013.01); *H01L 21/823431* (2013.01); *H01L 21/823437* (2013.01); *H01L 27/0886* (2013.01); *H01L 29/42364* (2013.01); *H01L 29/4966* (2013.01); *H01L 29/517* (2013.01); *H01L 29/518* (2013.01); *H01L 29/66545* (2013.01)

(56) References Cited

U.S. PATENT DOCUMENTS

| | | |
|---|---|---|
| 9,691,664 B1 | 6/2017 | Sung et al. |
| 2011/0147831 A1* | 6/2011 | Steigerwald .... H01L 21/823431 257/330 |
| 2014/0103404 A1 | 4/2014 | Li et al. |
| 2014/0117447 A1 | 5/2014 | Basker et al. |
| 2016/0336405 A1* | 11/2016 | Sun ................... H01L 29/42392 |

* cited by examiner

METHODS, APPARATUS AND SYSTEM FOR FORMING A FINFET DEVICE COMPRISING A FIRST PORTION CAPABLE OF OPERATING AT A FIRST VOLTAGE AND A SECOND PORTION CAPABLE OF OPERATING AT A SECOND VOLTAGE

BACKGROUND OF THE INVENTION

Field of the Invention

Generally, the present disclosure relates to the manufacture of sophisticated semiconductor devices, and more specifically, to various methods for a hybrid oxide process for high voltage input/output (I/O) portions of a FinFET device.

Description of the Related Art

The fabrication of advanced integrated circuits, such as CPU's, storage devices, ASIC' s (application specific integrated circuits) and the like, requires the formation of a large number of circuit elements in a given chip area according to a specified circuit layout, wherein so-called metal oxide field effect transistors (MOSFETs or FETs) represent one important type of circuit element.

FIG. 1 illustrates a stylized cross-sectional depiction of a state-of-the-art finFET device. A finFET device 100 illustrated in FIG. 1 comprises a plurality of "fins" 110. The source and drain of the finFET are placed horizontally along the fin. A high-k metal gate 120 wraps over the fin, covering it on three sides. The gate 120 defines the length of the finFET device. As dimensions in finFET devices become smaller, performing state-of-the-art gate cut processes subsequent to forming trench silicide contact features may result in residue on the edges of the gate cut regions, which may result in device operations problems.

In many cases, device fabricators establish processing flows that are efficient for producing low voltage, high-performance finFET devices. However, in some cases, it may be desirable to manufacture high-voltage devices. In order to accommodate this desire, designers have implemented alterations to normal manufacturing processes. However, manufacturing devices that are of higher voltage compared to standard voltages generally require implementation of various processes modifications that may cause additional process, integration complexities, and increased costs. For example, certain dielectric layers may be formed thicker than normal in order to accommodate higher than normal operating voltages. This can result in a requirement to modify fin profiles and overall dimensions of the device being manufactured.

In order to accommodate higher than normal voltage operations, designers have implemented thicker dielectric layers in a finFET device, which may have undesirable consequences, such as parasitic capacitances, leakage currents, device size issues, etc. Further, manufacturing devices that have both, a high voltage (HV) region and a low voltage (LV) region call for varied processing steps that require significant process alterations that may be costly and inefficient.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system involving forming a hybrid oxide layer for providing for a first region of a finFET device to operate at a first voltage and a second region of the finFET to operate at a second voltage. A first set of fins are formed on a first portion of a semiconductor substrate. A second set of fins are formed on a second portion of the semiconductor substrate. A first oxide layer is deposited on the first and second set of fins. A second oxide layer is deposited on the first and second set of fins. The thickness of the second oxide layer is based on a first operating voltage for the first portion, and the second oxide layer merges with the first oxide layer. The first and second oxide layers are removed from the second portion, such that the first portion is capable of operating at the first voltage and the second portion is capable of operating at a second voltage that is lower than the first voltage.

BRIEF DESCRIPTION OF THE DRAWINGS

The disclosure may be understood by reference to the following description taken in conjunction with the accompanying drawings, in which like reference numerals identify like elements, and in which.

Figure 1:
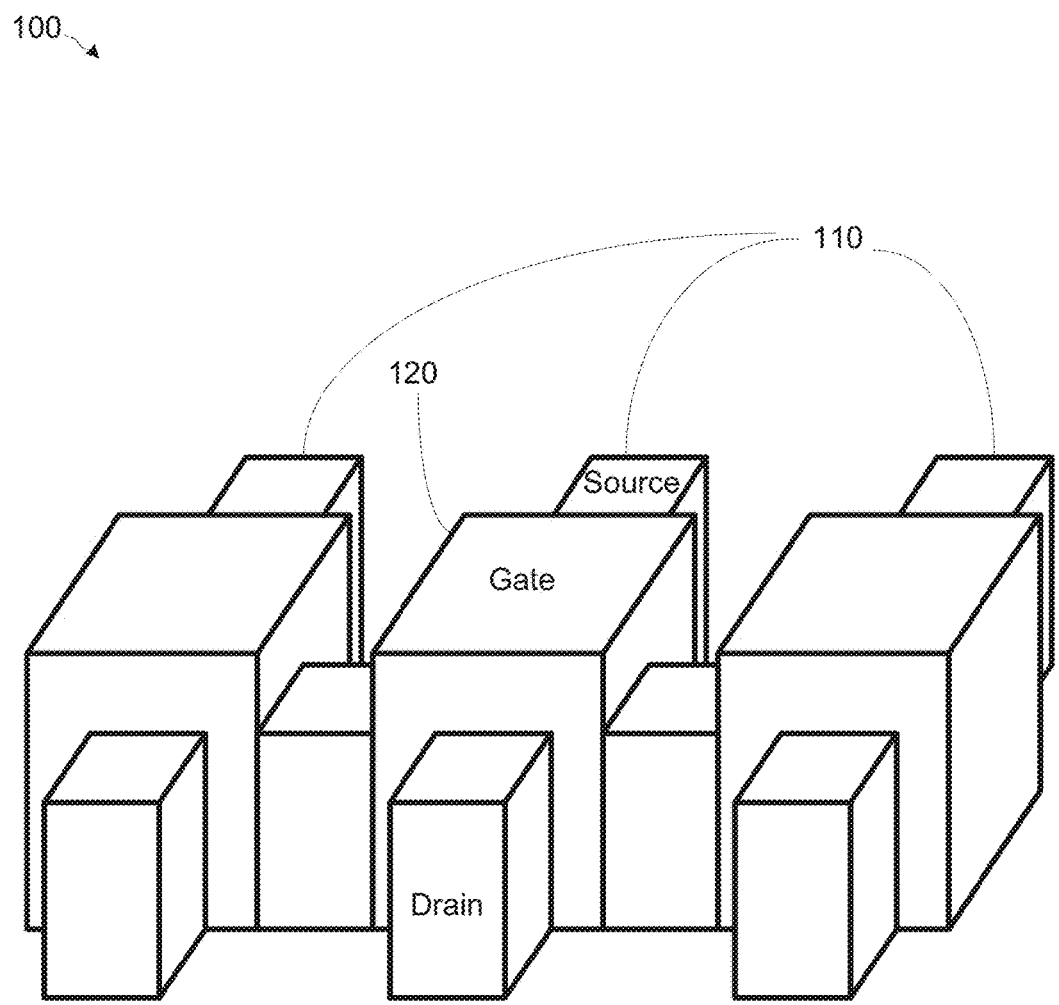
FIG. 1 illustrates a stylized cross-sectional depiction of a state-of-the-art finFET device prior to performing a gate cut process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Objects depicted in the drawings are not drawn to scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for a forming a hybrid oxide layer for manufacturing a finFET device that is capable of operating at a higher voltage. Embodiments herein provide for determining a desired operating voltage for a finFET device, determining a dielectric layer thickness for fins in a gate region based on the desired operating voltage, and using a hybrid dielectric layer process for forming the dielectric layer such that at least a portion of the finFET device is capable of operating at the desired voltage.

Embodiments herein call for modifying the thickness of an oxide layer using a hybrid oxide layer process substantially without modifying process parameters of other processing steps in forming an input/output (I/O) device portion of a finFET device. An oxide layer may be formed using normal process operation. Upon a determination that the thickness of the oxide layer is to be expanded, a secondary oxide deposition process, e.g., a plasma enhanced ALD process, may be performed to increase the thickness of the oxide layer such that the I/O device portion may operate at a higher voltage as compared to the operating voltage of a core device portion of the finFET device.

Embodiments call for forming an I/O device portion and a core device portion of a device based on a consistent or coherent process flow, while providing the feature of operating the I/O device portion at a first voltage and operating the core device portion operating at a second voltage. That is, using similar or coherent process flow, a device may be formed with the characteristic that an I/O device portion is a high voltage (HV) device portion, and the core device portion is a low voltage (LV) device portion.

In one embodiment, the I/O device portion may refer to a region of a device that comprises various circuitries for facilitating input and output communications between the device and other external devices. The circuitries may including, but are not limited to a signal driver, signal receiver, an input/output interface circuit, an analog to digital converter, a digital to analog converter, a signal encoder, signal decoder, a voltage down converter, a mixed-signal circuit interface between low power core devices, and/or the like.

In one embodiment, the core device portion may refer to a region of the device that comprises various circuitries for performing the core functions of the device. The circuitries may including, but are not limited to a processor, microcontroller, a digital signal processor, a field programmable gate array device, an encoder, a decoder, a memory portion, and/or the like.

Figure 2:
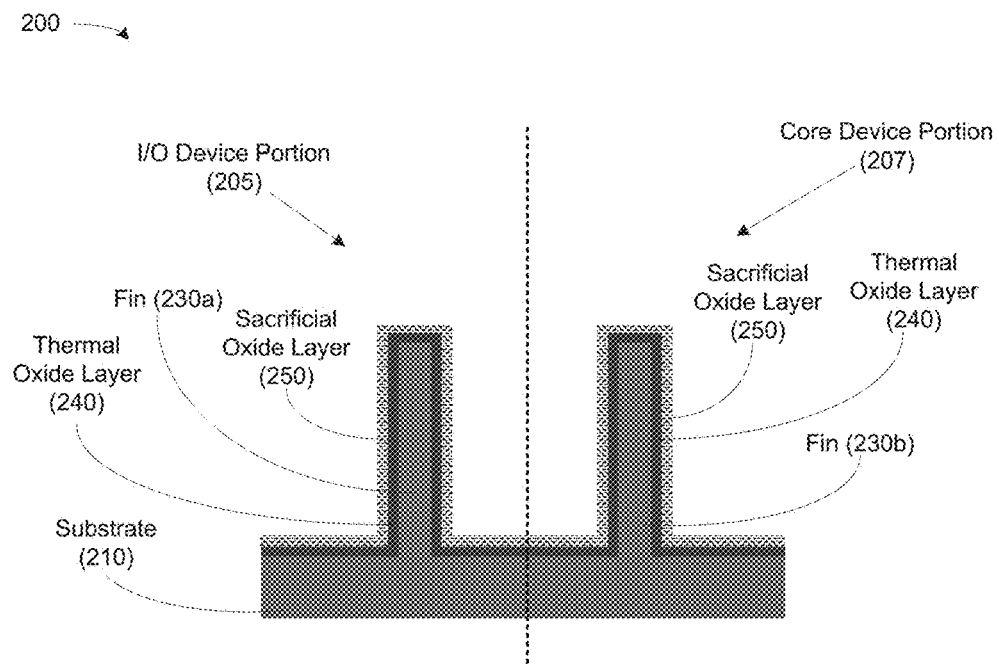
FIG. 2 illustrates a "Y-cut" cross-sectional view of a finFET device with respect to an oxide deposition process, in accordance with embodiments herein.

Turning now to FIG. 2, a stylized depiction of a "Y-cut" cross-sectional view of a finFET device with respect to an oxide deposition process, in accordance with embodiments herein, is illustrated. FIG. 1 illustrates a finFET device 200 having an I/O device region 205 and a core device portion 207.

The device 200 comprises a substrate layer 210 (e.g., silicon substrate, silicon germanium substrate, III-V, II-IV, III-N substrates, III-V Antimonide substrates etc.) encompassing the I/O device region 205 and the core device region 207. Using one of various techniques known to those skilled in the art, a plurality of fins are formed on the substrate layer 210. For ease of illustration, only one fin 230a is shown in the I/O device portion 205 and one fin 230b (collectively "230") in the core device portion 207. However, those skilled in the art would appreciate that additional fins may be formed in the portions 205, 207 and that each of the fins 230 may represent a plurality of fins. Each of the fins 230 may be part of a fin structure, which may include a fin 230 and a plurality of layers of materials that may be deposited on the fins 230. Some of the fins 230 may be PFET fins, while others may be NFET fins.

A thermal oxide layer 240 is formed over the fins 230, as well as over regions between the fins 230 in the I/O and core device portions 205, 207. The thermal oxide layer 240 may be formed using one of a plurality of growth processes known to those skilled in the art. In some embodiments, the thermal oxide processes may be an in-situ steam generated (ISSG) thermal oxide formation containing $H_2/O_2$ gases, or $H_2/N_2O$ gas. This ISSG process may promote a reduction in excessive oxidation on the sidewalls of FinFET device in comparison to furnace based dry or wet $O_2$ based $SiO_2$ formation. In many embodiments, the process for forming the thermal oxide layer 240 may be based upon a normal process flow configured to manufacture finFET devices that are capable of operating at a predetermined low-voltage operation, e.g., 2.0 Volts Further, a sacrificial oxide layer 250 may be formed by depositing a thin layer of oxide over the thermal oxide layer 240. In some embodiments, the sacrificial oxide layer 250 may be comprised of an atomic layer deposition (ALD) for depositing an $SiO_2$ (thermal and PEALD), ALD AlOx, TiOx, HfOx, or LaO material, wherein in some embodiments, x is an integer, and in other embodiments, x may be a fraction. In one embodiment, the sacrificial oxide layer 250 is deposited for filling in three dimensional (3D) voids that may have developed during gate patterning (etch) process at the interface of substrate, gate and spacer.

Figure 3:
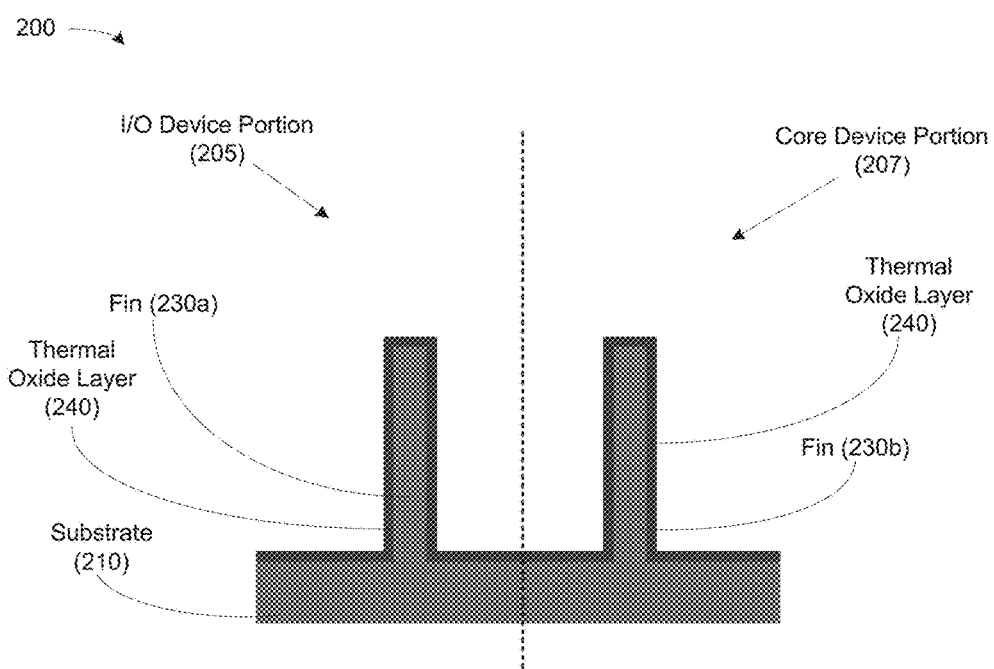
FIG. 3 illustrates a stylized depiction of the Y-cut cross-sectional view of the finFET device with respect to an oxide removal process, in accordance with embodiments herein.

FIG. 3 illustrates a stylized depiction of the Y-cut cross-sectional view of the finFET device 200 with respect to an oxide removal process, in accordance with embodiments herein. The sacrificial oxide layer 250 is removed, exposing the thermal oxide layer 240. In one embodiment, the sacrificial oxide layer 250 may be removed using a wet etch process. After removal of the sacrificial oxide layer 250, 3D voids that may have been present in the interface region of the substrate 210 and the thermal oxide layer 240 (under the gate region) is filled in by the sacrificial oxide layer 250 and remains filled-in after the removal of the sacrificial oxide layer 250.

Figure 4:
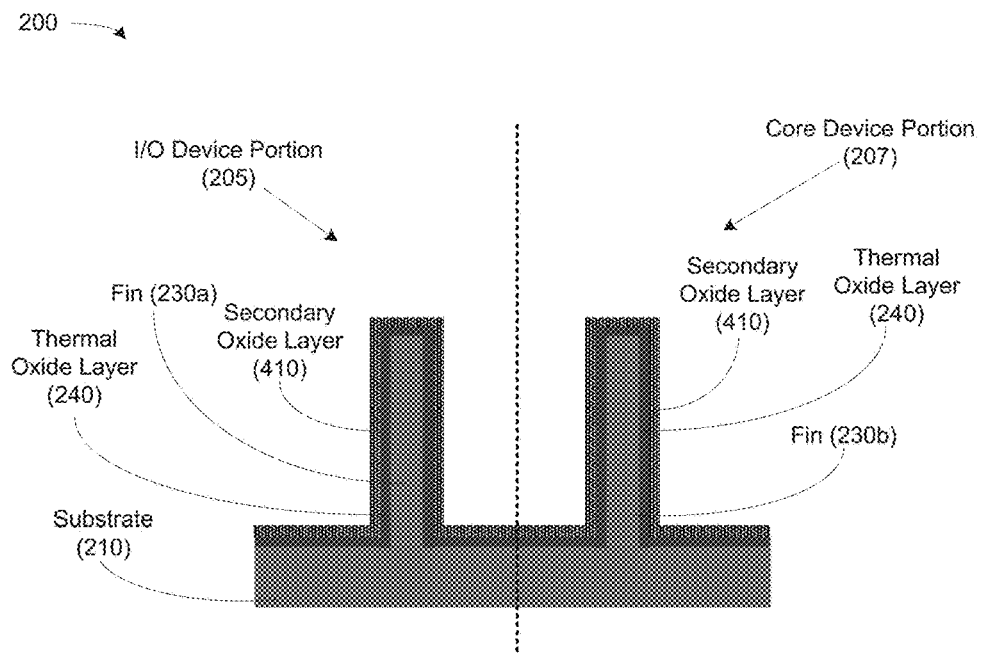
FIG. 4 illustrates a stylized depiction of the Y-cut cross-sectional view of the finFET device with respect to a supplemental oxide layer deposition process, in accordance with embodiments herein.

FIG. 4 illustrates a stylized depiction of the Y-cut cross-sectional view of the finFET device 200 with respect to a supplemental oxide layer deposition process, in accordance with embodiments herein. A supplemental or secondary oxide layer 410 may be formed over the thermal oxide layer 240. In some embodiments, the supplemental oxide layer 410 may be deposited using a plasma enhanced atomic layer deposition (ALD) process. In one embodiment, this plasma ALD process may be performed at a temperature in the range of about 350° C. to about 450° C. In one embodiment, the process for forming the supplemental oxide layer 410 may be also comprise a plasma nitridation, using a decoupled plasma nitridation (DPN) process to add nitrogen (N %) in the range of about 3% by atomic percentage to about 10% by atomic percentage, followed up with a post nitridation anneal (PNA) process using a temperature in the range of about 300° C. to about 800° C., for about 30 seconds to about 300 seconds, and/or a decoupled plasma oxidation (DPO) process.

The formation of the supplemental oxide layer 410 effectively creates a hybrid oxide layer with a greater thickness compared to the original oxide layer 240. That is, the combination of the thermal oxide layer 240 and the supplemental oxide layer 410 combines to form a single, hybrid oxide layer.

The thickness of the supplemental oxide layer 410 is determined based on the desired thickness of the hybrid oxide layer. The thickness of the hybrid oxide layer in turn, is determined based on the desired increased voltage operation of the finFET device 200 or at least a portion of the finFET device 200, e.g., the I/O device portion 205 of the finFET device 200. The thickness of the hybrid oxide layer may be proportional to the operating voltage, wherein a thicker hybrid oxide layer provides for a higher operating voltage, and vice versa.

The supplemental oxide layer 410 may be a so-called "top-off layer." In one embodiment, this layer may be comprised of ALD $SiO_2$ with plasma nitridation and anneal. The nitride percentage may be in the range of about 3% to about 10%. The anneal temperature may be in the range of about 300° C. to about 800° C. The materials used for forming the supplemental oxide layer 410 may include, but is not limited to, AlO, TiO, HfO, LaO, and/or the like.

Based on the operating voltage desired, the thickness of the supplemental oxide layer 410 is grown such that the overall hybrid oxide layer provides a sufficient thickness to allow at least a portion of the device 200 to be able to operate at a higher, pre-determined operating voltage (e.g., 3 Volts instead of 1.5 Volts operating voltage. This process may be performed without changing the predetermined process flow and/or design parameters (e.g., fin height or thickness, fin dopant profile, etc.). The thicker overall top-off layer/hybrid oxide layer allows higher operating voltage without revamping other portions of the device, such as the fins 230.

In some embodiments, additional supplemental oxide layers may be added in a similar manner as the supplemental oxide region 410. Therefore, in some embodiments, a second supplemental oxide layer may be added after having added a first supplemental oxide region (410). That is, in alternative embodiments, three or more supplemental oxide regions may be deposited, i.e., the hybrid oxide layer may comprise the thermal oxide layer 240, a first supplemental oxide region, and a second supplemental oxide region. These oxide layers may merge into effectively a thicker hybrid oxide layer, capable of providing higher voltage operations.

In one embodiment, the deposition of the supplemental oxide layer 410 is performed after removal of a dummy gate region (not shown) that was formed on the device 200. A poly-pull process known to those skilled in the art may be performed in order to implement a replacement metal gate (RMG) process at a later time. The deposition of the supplemental oxide layer 410 may be implemented after performing the poly-pull process, but prior to performing the RMG process.

Figure 5:
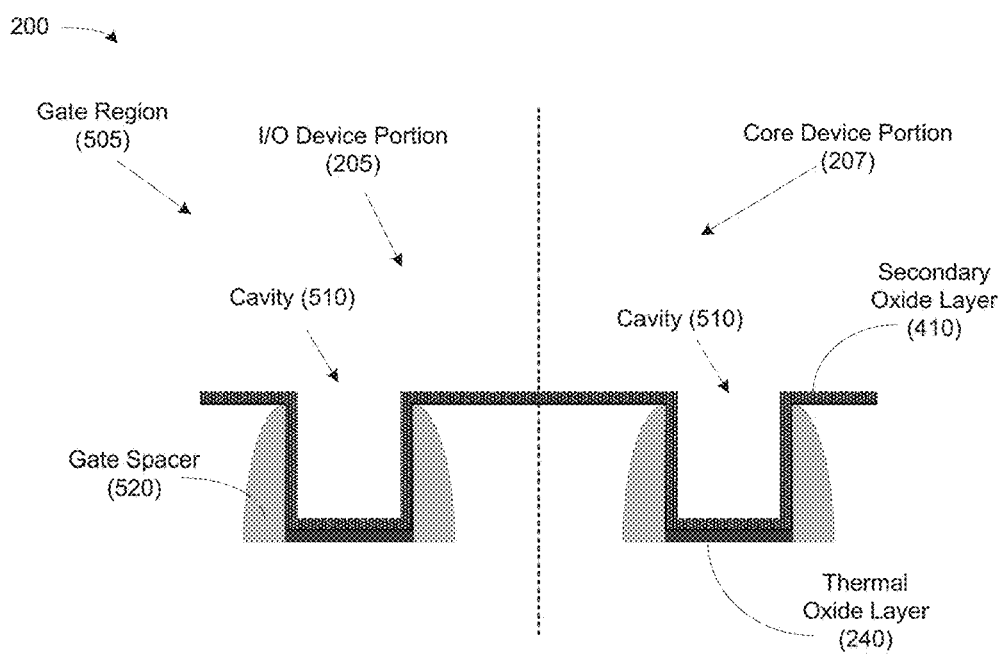
FIG. 5 illustrates a stylized depiction of an X-cut cross-section view of the finFET device with respect to the view shown in FIG. 4, in accordance with embodiments herein.

FIG. 5 illustrates a stylized depiction of an X-cut cross-sectional view of the finFET device with respect to the view shown in FIG. 4, in accordance with embodiments herein. The X-cut cross-sectional view of FIG. 5 is a perpendicular view with respect to the Y-cut cross-sectional view of FIG. 4. FIG. 5 depicts a gate region 505, comprising a plurality of cavities 510. FIG. 5 depicts the thermal oxide layer 240 at the bottom of the cavities 510. When depositing the supplemental oxide layer 410, the inner regions of the cavities 510 may be lined with the supplemental oxide layer 410. As described above, the thermal oxide layer 240 and the supplemental oxide layer 410 may merge into a single hybrid oxide layer with a larger thickness. As described in further details below, an RMG process will substantially fill the cavities 510 with gate metal features.

Figure 6:
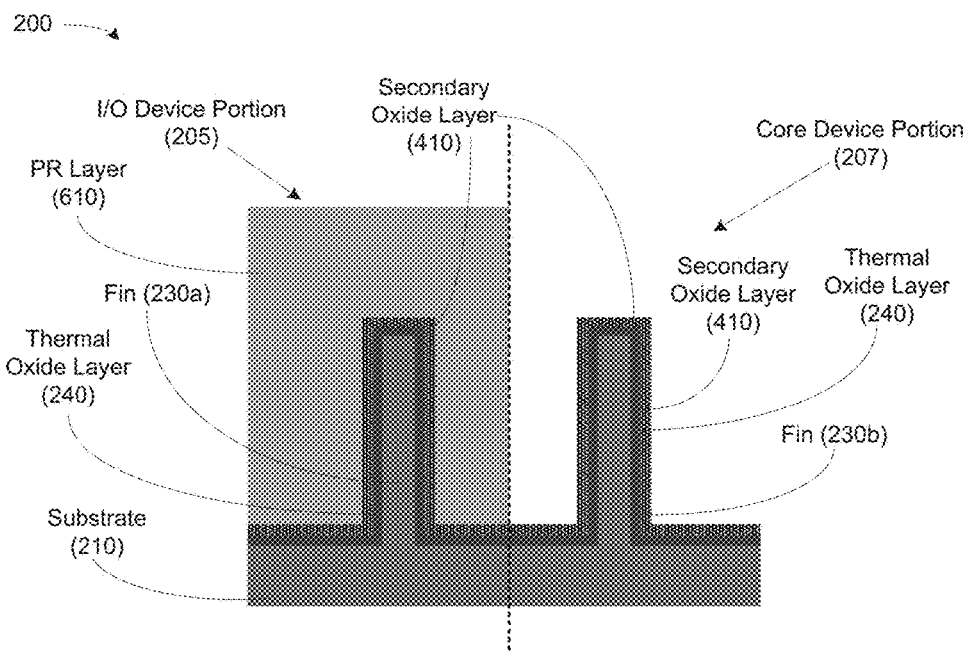
FIG. 6 illustrates a stylized depiction of the Y-cut cross-sectional view of the finFET device with respect to a blocked area shown as photoresist process in accordance with embodiments herein.

Turning now to FIG. 6, a stylized depiction of the Y-cut cross-sectional view of the finFET device 200 with respect to a hard mask process, in accordance with embodiments herein, is illustrated. A photoresist block (PR) layer 610 is implemented on the I/O device portion 205, as shown in FIG. 5. The PR block layer 610 may comprise resist material capable of withstanding an oxide etch process. The PR block layer 510 may be formed using a positive photo sensitive organic material, such as (diazonaphthloquinone—DNQ) based resist or other material that is capable of protecting features from an oxide etch process. The deposition of the PR block layer 610 is limited to the I/O device portion 205, as depicted by a stylized dotted line to signify separation between the I/O device portion 205 and the core device portion 207.

Figure 7:
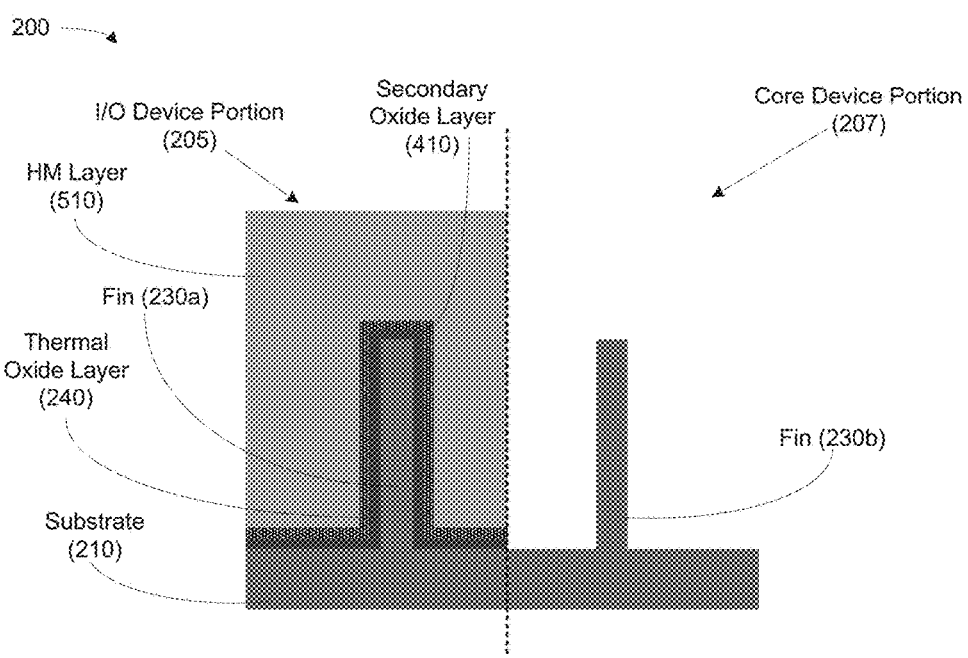
FIG. 7 illustrates a stylized depiction of the Y-cut cross-sectional view of the finFET device with respect to an oxide etch process, in accordance with embodiments herein.

Turning now to FIG. 7, a stylized depiction of the Y-cut cross-sectional view of the finFET device 200 with respect to an oxide etch process, in accordance with embodiments herein, is illustrated. An etch process may be performed to remove the hybrid oxide layer (i.e., the thermal oxide layer 240 and the supplemental oxide layer 410) in the core device portion 207. During this etch process, the I/O device portion is protected by the PR layer 610. The hybrid oxide layer is removed from the fin 230b as well as from regions surrounding the fin 230b.

Figure 8:
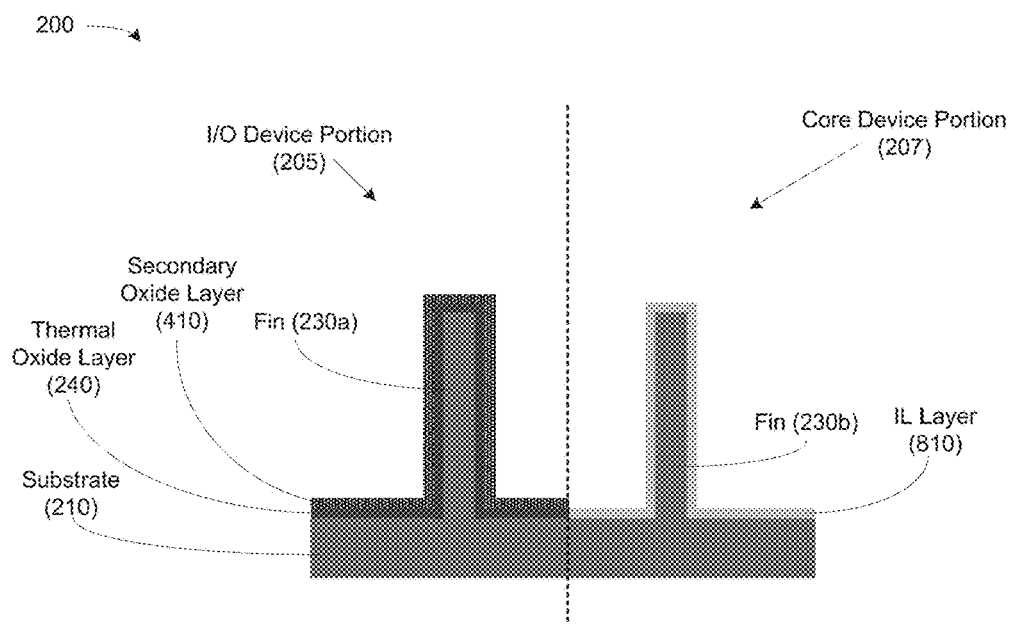
FIG. 8 illustrates a stylized depiction of the Y-cut cross-sectional view of the finFET device with respect to an interfacial layer (IL) process, in accordance with embodiments herein.

FIG. 8 illustrates a stylized depiction of the Y-cut cross-sectional view of the finFET device 200 with respect to an interfacial layer (IL) process, in accordance with embodiments herein. An interfacial layer (IL) 810 is grown over the fin 230b in the core device region 207. In one embodiment, the IL layer 810 may be grown using an $O_3$/HCL wet process. In some embodiments, the IL layer 810 may be made of $SiO_2$, $GeO_2$, HfSiO, SiON, or the like. The IL layer 810 may be deposited using an ALD process, thermal oxidation process, chemical vapor deposition (CVD) process, etc. The thickness of the IL layer 810 may be in the range from about 2 Å to about 10 Å.

Further, the PR layer 610 is removed from the I/O device region 205. This leaves the I/O device region 205 covered with the hybrid oxide layer, and the core device region 207 covered with the IL layer 810.

Figure 9:
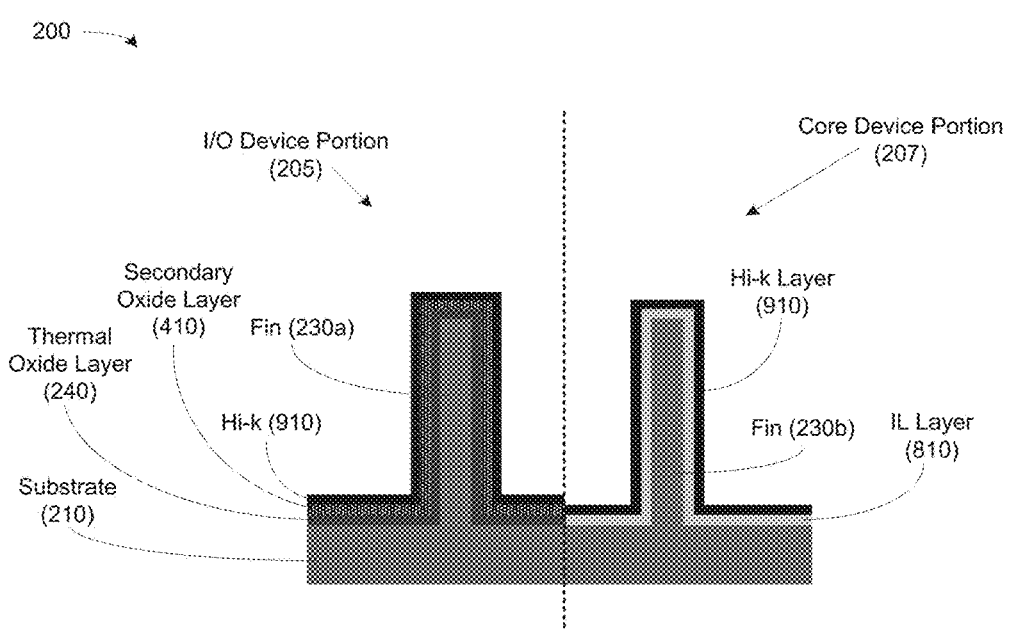
FIG. 9 illustrates a stylized depiction of the Y-cut cross-sectional view of the finFET device with respect to a high-k layer deposition process, in accordance with embodiments herein.

FIG. 9 illustrates a stylized depiction of the Y-cut cross-sectional view of the finFET device 200 with respect to a high-k layer deposition process, in accordance with embodiments herein. A layer of hi-k material is deposited over the device 200 to form a hi-k layer 910. The I/O device region 205 and the core device region 207 will then comprise a layer of hi-k material 910. The hi-k layer 910 may be comprised of HfOx material, wherein x is an integer.

Figure 10:
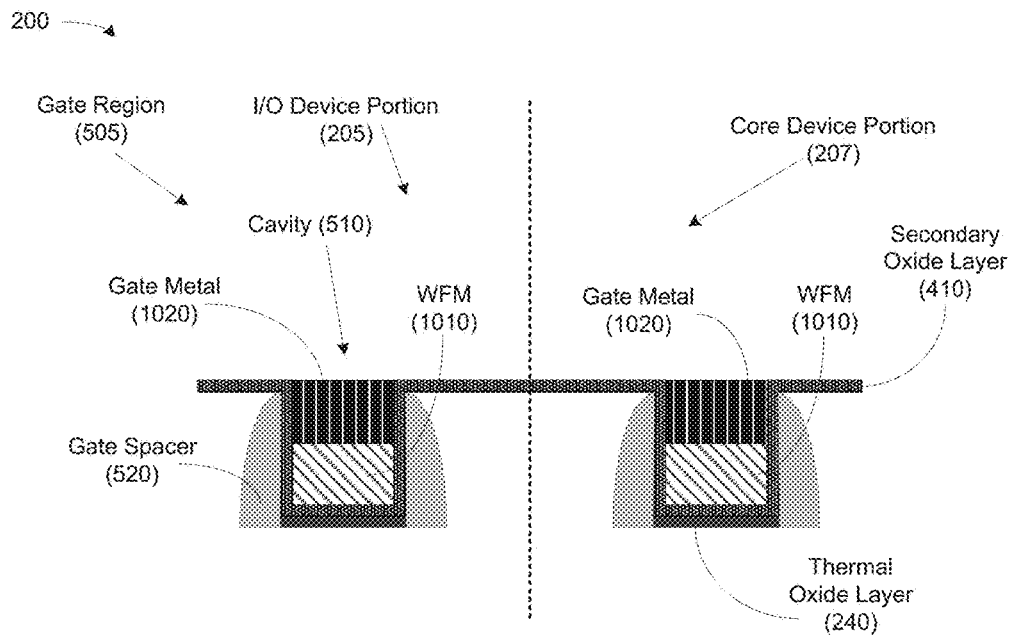
FIG. 10 illustrates a stylized depiction of an X-cut cross-sectional view of the finFET device with respect to the view shown in FIG. 9, in accordance with embodiments herein.

FIG. 10 illustrates a stylized depiction of an X-cut cross-sectional view of the finFET device with respect to the view shown in FIG. 9, in accordance with embodiments herein. The X-cut cross-sectional view of FIG. 10 is a perpendicular view with respect to the Y-cut cross-sectional view of FIG. 9. FIG. 10 depicts a gate region 505, comprising the plurality of cavities 510. The thermal oxide layer 240 at the bottom of the cavities 510 is covered with the supplemental/secondary oxide layer 410. Other inner regions of the cavities 510 may also be lined with the secondary oxide layer 410. The hybrid oxide layer is sufficiently thick to accommodate a predetermined operation voltage of the device 200.

Upon performing an RMG process, a layer of work function metal (WFM) 1010 is deposited in the cavities 510. Further, as part of the RMG process, a gate metal layer 1020 is formed above the WFM layer 1010. The gate metal layer 1020 may be comprised of tungsten (W), cobalt (Co), copper (Cu), or the like. In one embodiment, the WFM layer 1010 and gate metal layer 1020 may be formed such that there is no recess in the cavity 510. In other embodiments, the WFM layer 1010 and gate metal layer 1020 may be formed such that a recess is formed in the cavity 510.

In this manner, one portion of the device 200 (e.g., the I/O device portion 205) may be configured to operate at a first voltage, while a second portion of the finFET device 200 (e.g., the core device portion 207) may be configured to operate at a second voltage. Accordingly, the device 200 is capable of being configured to operate at different voltage levels in different portions of the device 200. As such, similar process design and parameters may be used to manufacture an I/O device region that operates at a first voltage, as well as a core device region that operates at a second voltage. In one embodiment, the first voltage is higher than the second voltage. That is, the maximum operating voltage of at least a portion of the finFET device 200 may be tunable using the supplemental/secondary oxide layer to create a hybrid oxide layer.

Figure 11:
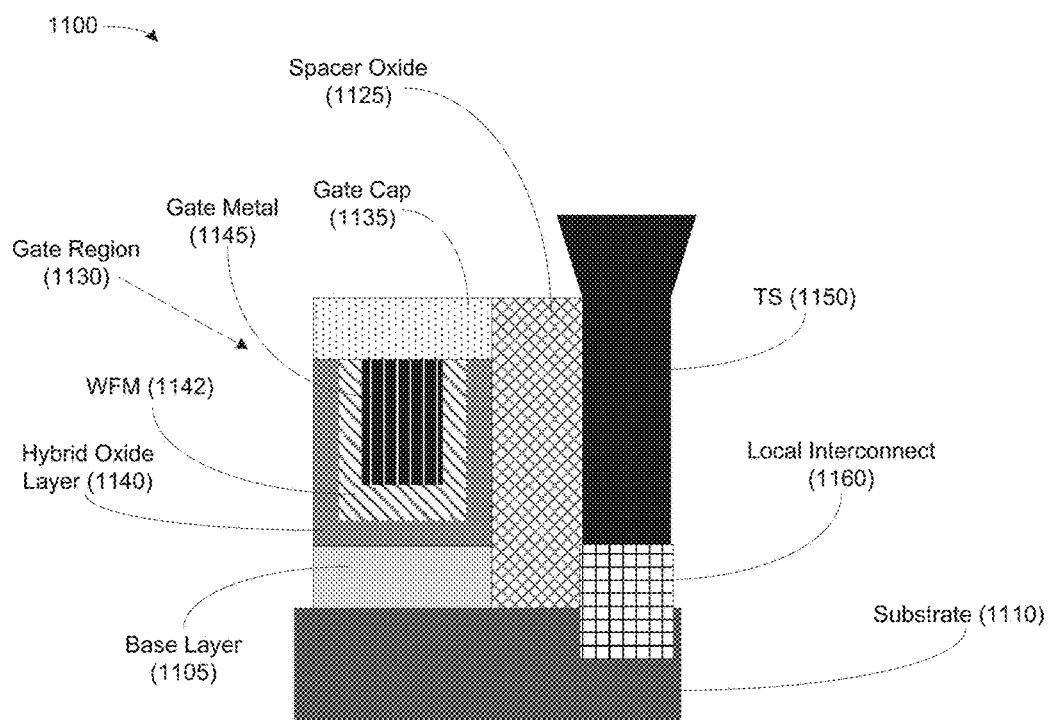
FIG. 11 illustrates a broader, stylized depiction of cross-sectional view of the finFET device 200, in accordance with embodiments herein.

FIG. 11 illustrates a broader, stylized depiction of cross-sectional view of a finFET device having a hybrid oxide layer, in accordance with embodiments herein. A finFET device 1100 comprises a substrate 1110, on which a base layer 1105 is formed. A gate region 1130 is formed over the base layer 1105. In one embodiment, the gate region 1130 may be part of an I/O device portion of the finFET device 1100.

The gate region 1130 comprises a hybrid oxide region 1140, which lines a void that is filled with a WFM region 1142, and a gate metal region 1145. The gate region 1130 also comprises a gate cap 1135 over the hybrid oxide region 1140, WFM region 1142, and the gate metal region 1145.

The device 1100 also comprises a trench silicide (TS) region 1150, which may be formed over a source/drain (S/D) region adjacent the gate region 1130. The TS region 1150 may be formed over a local interconnect feature 1160, which may be formed on the S/D region. The gate region 1130 and the TS region 1150 are separated by a spacer oxide region 1125.

Accordingly, the WFM region 1142 and the gate metal region 1145 are separated from the TS region 1150 by the spacer oxide 1125. That is, a first metal region (i.e., the WFM region 1142 and the gate metal region 1145) is separated by a second metal region (i.e., the TS region 1150) by a dielectric region (i.e., the spacer oxide region 1125). Therefore, these two metal regions are separated by the spacer dielectric region, which at sufficiently high voltage, may cause higher leakage and lower breakdown voltage for highly scaled dimensions (e.g., below 10 nm spacing). This could also cause operation breakdown, e.g., time-dependent dielectric (TDDB) breakdown voltage. However, for operations at higher voltages, the introduction of hybrid oxide layer 1140 may lead to higher operating voltage for PC-TS regions in I/O devices. Additional oxide layer inside the I/O gate cavity may increase parasitic capacitances, but reduce leakage current, and increase breakdown voltage between PC-TS regions, while also enabling area scaling for I/O devices. Hybrid oxide thickness adjustments can also enable different higher voltage design points depending upon the application and device design. Thus, embodiments herein provide for adjusting the oxide thickness of an I/O device portion without changing process parameters and/or electrical parameters of the core device region of a device.

Figure 12:
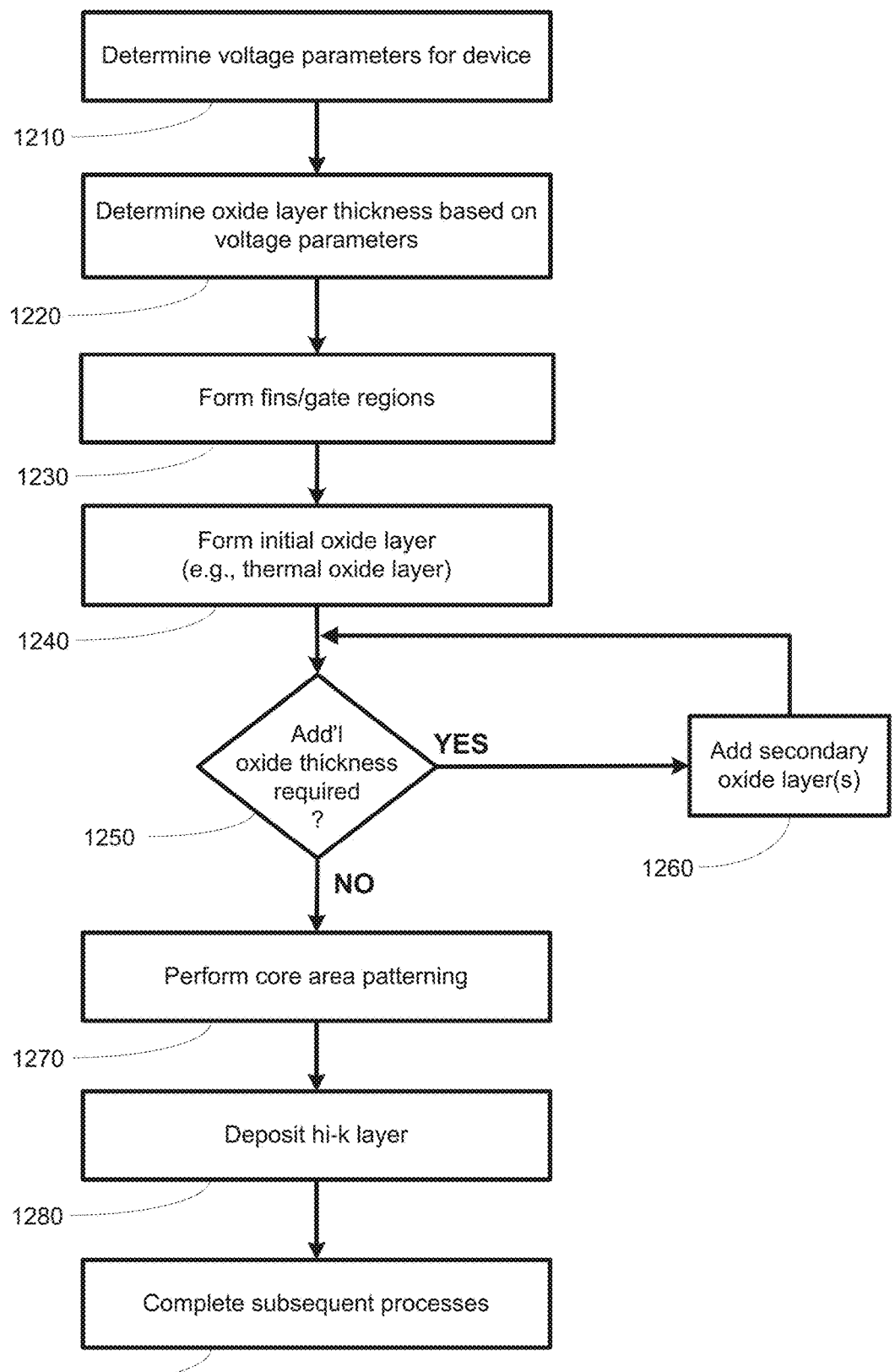
FIG. 12 illustrates a flowchart depiction of the method for forming a hybrid oxide layer for a finFET device, in accordance with embodiments herein.

Turning now to FIG. 12, a flowchart depiction of the method for forming a hybrid oxide layer for a finFET device, in accordance with embodiments herein, is illustrated. Voltage parameters for a finFET device are determined (at 1210) based on device design and application. This process may include determining the operating voltage of different portions of a device. For example, a determination may be made that an I/O portion of the device may operate at a high voltage (HV) (e.g., 3 Volts or greater), while the core portion of the device may operate at a low voltage (LV) (e.g., 0.9 Volts or less Based on the operating voltages of different portions of the device, a determination may be made as to thickness of gate oxide layers (SiON+HfOx) of the HV and LV (HfOx only) portions of the device (at 1220). For example, for the HV operation in the I/O device portion, a thickness of about 0.3 nm to about 0.7 nm of SiON may be desired. For the LV operation in the core device portion, there is no SiON portion, and a thickness of HfOx is in the range of about 0.15 nm to about 0.3 nm may be desired.

Various fins and gate regions may be formed in the I/O regions and the core regions of the device (at 1230). An initial oxide layer may be formed over the fins (at 1240). In one embodiment, the initial oxide layer is formed using a standard thermal oxide layer deposition process in both the HV and LV portions of the device. Based upon the thickness-determinations described above in relation to the operating voltages from step 1210, a determination is made whether additional oxide thickness is required (at 1250). Based on the value of the HV portion, a determination may be made that the thickness of the thermal oxide layer may be insufficient, and thus, additional thickness is required for the HV portion.

Upon a determination that additional oxide thickness is desired, a supplemental/secondary layer of oxide layer is deposited (at 1260). This process may include a top-off treatment with DPN (plasma nitridation) or DPO (plasma oxidation), after performing an ALD oxide deposition process. In one embodiment, the steps 1250 and 1260 may be repeated multiple times until a satisfactory hybrid oxide layer thickness to form a hybrid oxide layer to accommodate the higher operating voltage is achieved.

After required oxide thickness is achieved to meet maximum voltage requirements, an LV or core area patterning process may be performed (at 1270), as exemplified in FIGS. 6-8. This process may comprise depositing a photoresist as a block region over the HV or I/O device portion, removing hybrid oxide layer from the LV or core device portion, performing an IL layer formation in the LV/core device portion and removing the hard mask.

A layer of hi-k material may then be deposited, forming a hi-k layer over the fins (at 1280). Additional processing, e.g., RMG processing, may be performed to complete forming the finFET device (at 1290). In this manner, using a uniform process flow, an LV core portion may be formed, while an HV I/O portion may also be formed by implementing a hybrid oxide layer for HV operations.

Figure 13:
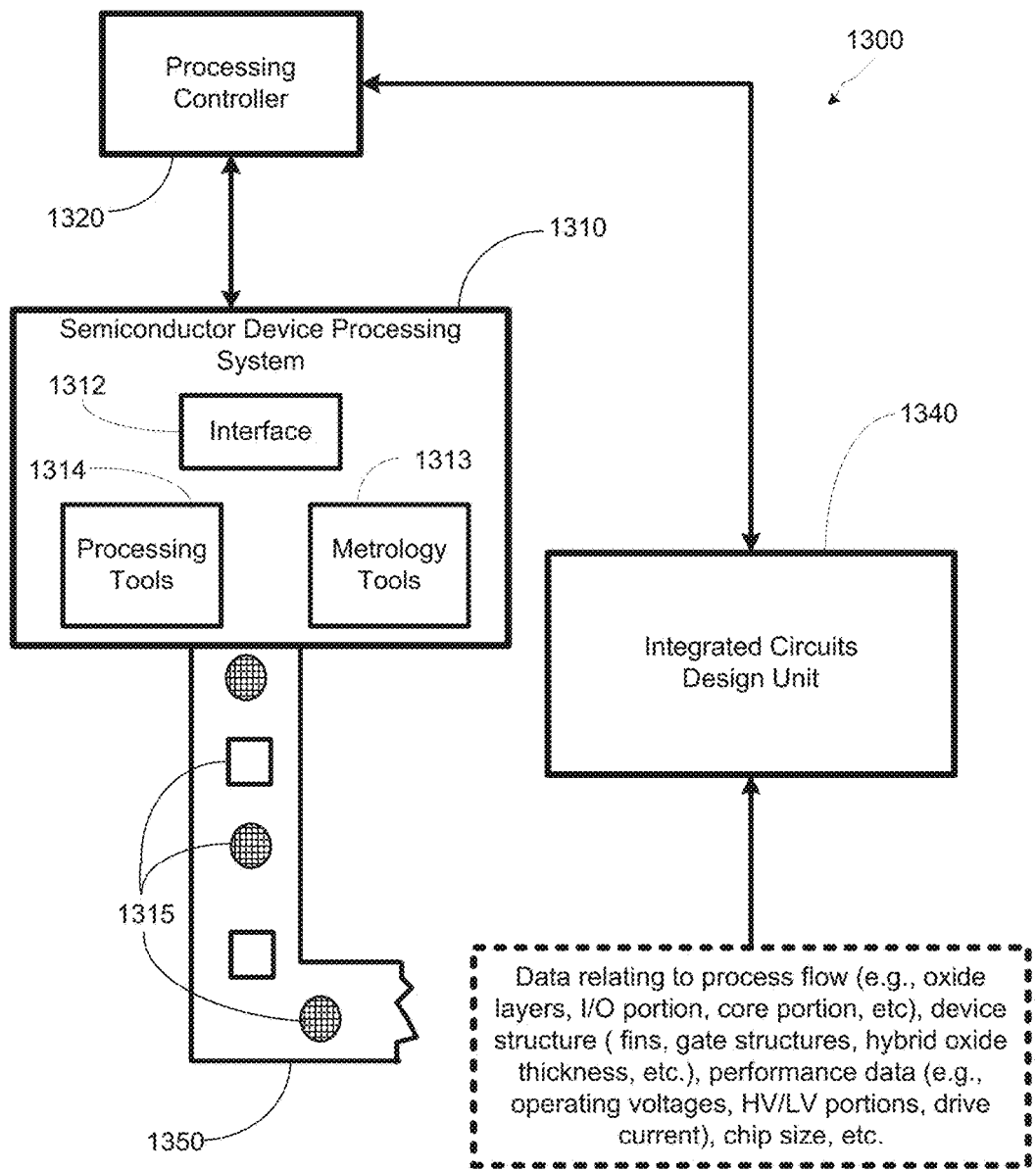
FIG. 13 illustrates a stylized depiction of a system for fabricating a semiconductor device comprising a hybrid oxide layer for a finFET device, in accordance with embodiments herein.

Turning now to FIG. 13, a stylized depiction of a system for fabricating a semiconductor device comprising an integrated circuit having a hybrid oxide layer, in accordance with embodiments herein, is illustrated. The system 1300 provides forming a HV portion and a LV portion of a device using a uniform processing regimen. A hybrid oxide layer may be formed in the HV region to provide high voltage operation while performing similar, uniform processing of both the HV and LV portions of a finFET device. The system 1300 of FIG. 13 may comprise a semiconductor device processing system 1310 and a design unit 1340. The semiconductor device processing system 1310 may manufacture integrated circuit devices based upon one or more designs provided by the design unit 1340.

The semiconductor device processing system 1310 may comprise various processing stations, such as deposition (e.g., ALD, PECVD, etc.) stations, etch process stations, photolithography process stations, CMP process stations, etc. One or more of the processing steps performed by the processing system 1310 may be controlled by the processing controller 1320. The processing controller 1320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1310 may produce integrated circuits on a medium, such as silicon wafers. More particularly, the semiconductor device processing system 1310 produce integrated circuits having finFET devices that comprise hybrid oxide layers for HV portions of the device. The HV portions may be I/O regions, while the LV portions may be core regions of the finFET device.

The production of integrated circuits by the device processing system 1310 may be based upon the circuit designs provided by the integrated circuits design unit 1340. The processing system 1310 may provide processed integrated circuits/devices 1315 on a transport mechanism 1350, such as a conveyor system. In some embodiments, the transport system may be sophisticated clean room transport systems that are capable of transporting semiconductor wafers. In one embodiment, the semiconductor device processing system 1310 may comprise a plurality of processing steps to perform deposition of material comprising intrinsic stress into gate cut regions In some embodiments, the items labeled "1315" may represent individual wafers, and in other embodiments, the items 1315 may represent a group of semiconductor wafers, e.g., a "lot" of semiconductor wafers. The integrated circuit or device 1315 may be a transistor, a capacitor, a resistor, a memory cell, a processor, and/or the like.

The integrated circuit design unit 1340 of the system 1300 is capable of providing a circuit design that may be manufactured by the semiconductor processing system 1310. The integrated circuit design unit 1340 may be capable of determining operating voltage of the LV and HV portions, and using this information to determine the thickness of a hybrid oxide layer, and performing the formation of a hybrid oxide layer in the HV regions.

The integrated circuit design unit 1340 may also determine the thickness of a hybrid oxide layer in an HV region of a finFET device, the height of the fins, the size of the fin channels, etc. Based upon such details of the devices, the integrated circuit design unit 1340 may determine specifications of the finFETs that are to be manufactured. Based upon these specifications, the integrated circuit design unit 1340 may provide data for manufacturing a semiconductor device having hybrid oxide layer features provided by embodiments herein.

The system 1300 may be capable of performing analysis and manufacturing of various products involving various technologies. For example, the system 1300 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a first set of fins on a first portion of a semiconductor substrate;
   forming a second set of fins on a second portion of said semiconductor substrate;

depositing a first oxide layer on said first and second set of fins;

depositing a second oxide layer on said first and second set of fins, wherein the thickness of said second oxide layer is based on a first operating voltage for said first portion, and wherein said second oxide layer merges with said first oxide layer;

removing said first and second oxide layers from said second portion;

forming an interfacial layer over said second portion after removing said first and second oxide layers from said second portion;

depositing a hi-k material over said first portion and said second portion; and performing a replacement metal gate (RMG) process comprising depositing work function metal (WFM) layer in a gate cavity and depositing a gate metal selected from the group consisting of tungsten, cobalt, and copper, over said WFM layer;

wherein said first portion is capable of operating at said first voltage and said second portion is capable of operating at a second voltage that is lower than said first voltage;

wherein depositing the second oxide layer comprises performing at least one of an atomic layer deposition (ALD) process or a plasma enhanced ALD (PEALD), wherein said second oxide layer comprises at least one of SiO2, SiON, Al2O3, Hf2O, La2O3, or TiO2;

wherein depositing the second oxide layer comprises performing a plasma nitridation process, wherein said plasma nitridation process comprises a decoupled plasma nitridation (DPN) process using a substrate temperature in the range of about 23° C. to about 500° C., wherein the atomic percentage in the second oxide layer is in the range of about 3% to about 7%, and wherein the overall nitrogen atomic percentage in the merged first and second oxide layers is in the range of about 10% to about 20%, and a rapid thermal anneal process performed after said DPN process, using a temperature in the range of about 500° C. to about 750° C.;

and wherein the method further comprises performing a decoupled plasma oxidation (DPO), after said ALD oxide deposition process to form a gate oxide hybrid layer combination, and performing another DPO process and at least one of a DPN process or a post nitridation anneal (PNA) process.

2. The method of claim 1, wherein forming a first set of fins on a first portion of a semiconductor substrate comprises forming a first set of fins in an input/output (I/O) device region of said substrate.

3. The method of claim 1, wherein forming a second set of fins on a second portion of said semiconductor substrate comprises forming the second set of fins in a core device region of said substrate.

4. The method of claim 1, wherein depositing said second oxide layer on said first and second set of fins comprises forming a hybrid oxide layer by merging said first and second oxide layers, wherein the thickness of the hybrid oxide layer is proportional to said first operating voltage.

5. The method of claim 1, wherein removing said first and second oxide layers from said second portion comprises:
forming a hard mask layer over said first portion;
performing an etch process to remove said first and second oxide layer in said second portion; and
removing said hard mask layer.

6. A method, comprising:
forming a first fin in an input/output (I/O) device portion of a semiconductor substrate;
forming a second fin in a core device portion of said semiconductor substrate;
depositing a first oxide layer on said first and second fins;
forming a hybrid oxide layer by depositing a second oxide layer on said first and second fins, wherein the thickness of said second oxide layer is based on a first operating voltage for said I/O device portion, and wherein said second oxide layer merges with said first oxide layer to form said hybrid oxide layer;
removing said hybrid layer from said core device portion;
forming an interfacial layer over said core device portion after removing said hybrid layer from said core device portion;
depositing a hi-k material over said core device portion and said I/O device portion; and
performing a replacement metal gate (RMG) process comprising depositing work function metal (WFM) layer in a gate cavity and depositing a gate metal selected from the group consisting of tungsten, cobalt, and copper, over said WFM layer;
wherein said I/O device portion is capable of operating at said first voltage and said core device portion is capable of operating at a second voltage that is lower than said first voltage;
wherein depositing the second oxide layer comprises performing an atomic layer deposition (ALD) process, wherein said second oxide layer comprises at least one of SiO2, SiON, Al2O3, Hf2O, La2O3, or TiO2;
wherein depositing the second oxide layer comprises performing a plasma nitridation process, wherein said plasma nitridation process comprises a decoupled plasma nitridation (DPN) process using a substrate temperature in the range of about 23° C. to about 500° C., wherein the atomic percentage in the second oxide layer is in the range of about 3% to about 7%, and wherein the overall nitrogen atomic percentage in the merged first and second oxide layers is in the range of about 10% to about 20%, and a rapid thermal anneal process performed after said DPN process, using a temperature in the range of about 500° C. to about 750° C.;
wherein depositing the second oxide layer comprises forming said second oxide layer after performing a poly-pull process and prior to performing a replacement metal gate (RMG) process;
wherein the method further comprises forming an oxide barrier layer on a sidewall of a gate cavity after performing said poly-pull process;
and wherein the method further comprises performing a decoupled plasma oxidation (DPO), after said ALD process to form the hybrid oxide layer, and performing another DPO process and at least one of a DPN process or a post nitridation anneal (PNA) process.

7. The method of claim 6, wherein depositing the second oxide layer comprises performing an atomic layer deposition (ALD) process.

8. The method of claim 6, further comprising forming a plurality of input/output (I/O) oxide regions by changing the thickness of said second oxide layer and performing a block lithography process.

9. A system, comprising:
a semiconductor device processing system capable of manufacturing a fin field effect transistor (finFET) device; and a processing controller operatively coupled to said semiconductor device processing system, said processing controller configured to control an operation of said semiconductor device processing system;

wherein said semiconductor device processing system is adapted to:

form a first set of fins on a first portion of a semiconductor substrate;

form a second set of fins on a second portion of said semiconductor substrate;

deposit a first oxide layer on said first and second set of fins;

deposit a second oxide layer on said first and second set of fins, wherein the thickness of said second oxide layer is based on a first operating voltage for said first portion, and wherein said second oxide layer merges with said first oxide layer;

remove said first and second oxide layers from said second portion;

form an interfacial layer over said second portion;

deposit a hi-k material over said first portion and said second portion; and perform a replacement metal gate process comprising depositing work function metal (WFM) layer in a gate cavity and depositing a gate metal selected from the group consisting of tungsten, cobalt, and copper, over said WFM layer;

wherein said first portion is capable of operating at said first voltage and said second portion is capable of operating at a second voltage that is lower than said first voltage;

wherein depositing the second oxide layer comprises performing at least one of an atomic layer deposition (ALD) process or a plasma enhanced ALD (PEALD), wherein said second oxide layer comprises at least one of SiO2, SiON, Al2O3, Hf2O, La2O3, or TiO2;

wherein depositing the second oxide layer comprises performing a plasma nitridation process, wherein said plasma nitridation process comprises a decoupled plasma nitridation (DPN) process using a substrate temperature in the range of about 23° C. to about 500° C., wherein the atomic percentage in second layer is in the range of about 3% to about 7%, and wherein the overall nitrogen atomic percentage in the merged first and second oxide layers is in the range of about 10% to about 20%, and a rapid thermal anneal process performed after said DPN process, using a temperature in the range of about 500° C. to about 750° C.; and perform a decoupled plasma oxidation (DPO), after said ALD oxide deposition process to form a gate oxide hybrid layer combination, and performing another DPO process and at least one of a DPN process or a post nitridation anneal (PNA) process.

10. The system of claim 9, further comprising a design unit configured to generate a first design comprising a definition for a process mask, a definition for an forming said first and second portions and said first and second oxide layers, wherein data from said design unit is used by said processing controller to control an operation of said semiconductor device processing system.

11. The system of claim 9, wherein:

said first portion is an I/O device portion;

said second portion is a core device portion; and said first and second oxide layer merge to form a hybrid oxide layer capable of providing operations at said first voltage.

12. The system of claim 11, wherein:

said I/O device comprises at least one of a signal driver, a signal receiver, an input/output interface circuit, an analog to digital converter, a digital to analog converter, a signal encoder, or a signal decoder; and said core device portion comprises at least one of a processor, micro-controller, a digital signal process, a field programmable gate array device, a decoder, a memory portion.

13. The system of claim 9, wherein said semiconductor device processing system is adapted to remove said first and second oxide layers from said second portion by:

forming a hard mask layer over said first portion;

performing an etch process to remove said first and second oxide layer in said second portion; and removing said hard mask layer.

* * * * *